United States Patent [19]

Wolkstein et al.

[11] 4,167,681

[45] Sep. 11, 1979

[54] MICROWAVE POWER LIMITER COMPRISING A DUAL-GATE FET

[75] Inventors: Herbert J. Wolkstein, Livingston; Arye Rosen, Cherry Hill; Jitendra Goel, Kendall Park, all of N.J.

[73] Assignee: RCA Corporation, New York, N.Y.

[21] Appl. No.: 838,720

[22] Filed: Oct. 3, 1977

[51] Int. Cl.$^2$ .................. H03G 11/04; H04B 3/04
[52] U.S. Cl. .................. 307/237; 307/264; 328/171; 328/172; 333/17 L
[58] Field of Search .............. 307/237, 264; 333/17 L; 328/169–172

[56] References Cited

U.S. PATENT DOCUMENTS 4,079,325  3/1978  Mawhinney et al. ....... 307/233 R X

OTHER PUBLICATIONS

Rosen et al., *RCA Review* (pub.), vol. 38, 6/1977; pp. 253–256.

Int'l Microwave Symposium; *Microwaves* (pub.), pp. 9–10; 6/77.

Fukuda et al., IEEE Microwave Theory and Techniques (MTT) Conf.; 6/1977.

*Primary Examiner*—Larry N. Anagnos
*Attorney, Agent, or Firm*—H. Christoffersen; Joseph D. Lazar

[57] ABSTRACT

A microwave power limiter for generating an output RF signal of substantially constant power level in response to an input RF signal of varying power level comprises a dual gate field effect transistor (FET). The FET is biased such that the RF power output variation is small compared to the input power variation in the saturation region. A number of FET cascaded stages may be utilized to reduce this power output variation. A small signal amplifier including a number of FET cascaded stages may be employed in the limiter to increase the power level to that gain or drive level compatible with the saturated FET stages.

5 Claims, 9 Drawing Figures

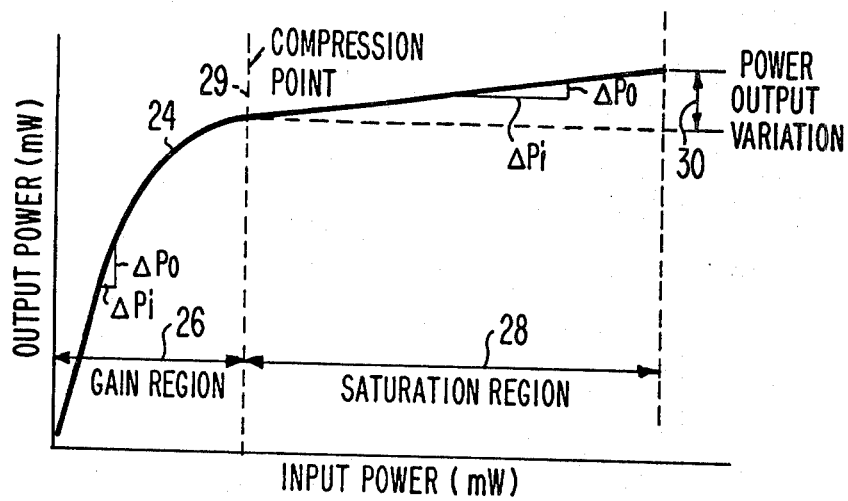
Fig. 2
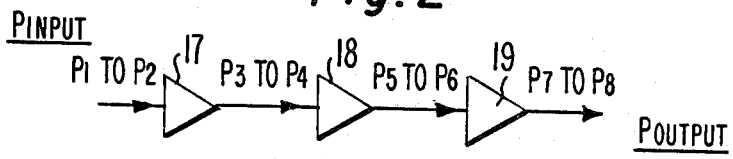
Fig. 3a
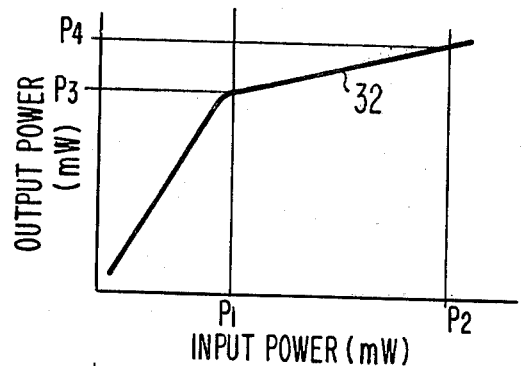
STAGE 17  Fig. 3b
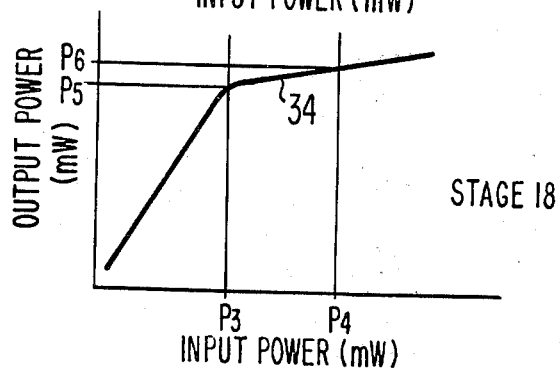
STAGE 18  Fig. 3c
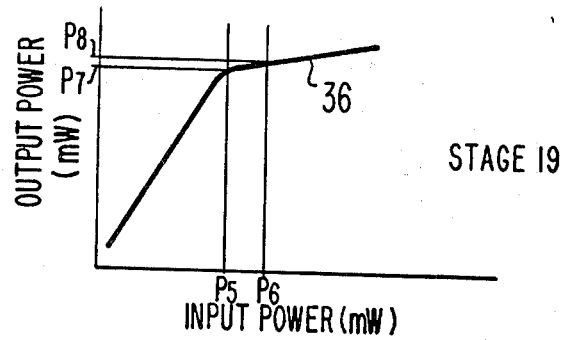
STAGE 19  Fig. 3d

MICROWAVE POWER LIMITER COMPRISING A DUAL-GATE FET

The Government has rights in this invention pursuant to Contract No. N00039-76-C-0280 awarded by the Department of the Navy.

CROSS REFERENCE TO RELATED APPLICATIONS

Of interest is the following copending U.S. application Ser. No. 838,656, filed on Oct. 3, 1978, entitled "Microwave Power Limiter Comprising a Single-Gate FET," based on the invention of Daniel David Mawhinney, Herbert J. Wolkstein, Arye Rosen and Zygmond Turski and assigned to the same assignee as is the present invention.

BACKGROUND OF THE INVENTION

1. Field of the Invention

This invention relates to a microwave power limiter and, more particularly, to a power limiter including a dual gate field effect transistor.

2. Description of the Prior Art

Many commercial and military systems require a source of constant RF power while simultaneously tolerating a wide variation of RF input power to the same system. It is often a system requirement that this fixed output power level be obtained over a wide frequency bandwidth. Such a power limiter having these desirable characteristics may be used as an RF amplifier, front end receiver where fixed output power is necessary for radar terrain mapping and associated video osscilloscope displays. Other limiter applications include receivers that are used for phase and frequency identification for electronic countermeasure (ECM) systems. In this application, fixed input power is generally applied to phase discrimination for accurate conversion of frequency (or phase) into an output dc voltage. A limiter having these properties may also be utilized for bi-phase and digital communications systems where coded binary signals are received and cannot be reconstructed to constant power output levels independent of the amplitude variations of the receiving antenna.

One of the conventional approaches for achieving constant (or standardized) output power, independent of drive variation and frequency, is to utilize a multistage high gain amplifier chain. This amplifier chain is designed to constrain operation of several of the output stages to the overdriven or saturation region where the output power swing is greatly compressed in spite of large variations in the input power range to the chain. Both bipolar silicon transistors and tunnel diode amplifiers (TDA) are used in such multistage limiters. The bipolar transistor limiter is restricted, however, to low frequency applications and is not often selected for use. For other limiting amplifier circuits see U.S. Pat. No. 3,940,704 issued Feb. 24, 1976 and U.S. Pat. No. 3,999,084 issued Dec. 21, 1976 which use operational amplifiers and U.S. Pat. No. 3,932,768 issued Jan. 13, 1976 and U.S. Pat. No. 4,008,440 issued Feb. 15, 1977 which utilize differential amplifiers.

The TDA is in wide use and has heretofore provided desirable amplifier-limiter capabilities. The TDA limiter suffers, however, from diverse problems and disadvantages, limiting the applications and performance of the TDA limiter. For instance, the power output for a broadband TDA is limited to levels of about −6 dbm (0.25 mW) or less. This power output level produces an RMS output voltage of less than 0.1 volt, with a video detector circuit having an impedance of 100 ohms. Such output is too low to drive a conventional phase interferometer-discriminator and detector without the use of video amplifiers. Another disadvantage of the TDA is that since it is a two terminal device used as a reflection amplifier, circulators for each stage and isolators between every other stage are needed for stability of the limiter. Such a multiplicity of interconnected components typically using ferrite materials produces many reflections which add in-and-out-of-phase resulting in considerable fine and coarse grain structure which directly reduces the accuracy when used with a discriminator. In such a discriminator system, for example, a variation of about 0.1 db will case an attendant error of approximately 80 MHz in a 4GHz band system. Furthermore, the use of necessary circulators and isolators in a multistage TDA configuration requires extensive circuitry and thereby, a relatively costly device.

For microwave discriminator applications, the output power variation as the input to the discriminator circuit is to be minimal. For example, to approach a frequency accuracy of 1 MHz in a 4 GHz bandwidth, due to output power variations of the RF limited output wave, would require an output power deviation or flatness of 0.025%. This is equivalent to an incremental power output fluctuation 36 db from saturation over the total variation in input drive range. With an input drive range of, for instance, 30 db, the combined values of input power swing and output limiting is equivalent to an overall compression ratio of 66 db. Considering the capabilities and costs, such a performance would be difficult, if not impossible, to achieve with the TDA limiter.

Use of Gallium Arsenide (GaAs) single gate field effect transistors (FET) arranged in a multistage configuration and operated in a satured condition has been suggested. (See the article in *Microwaves*, entitled "GaAs FETs Gain Ground in Oscillators, Mixers and Limiters," June, 1977, pages 9–10, and a paper published in the minutes of the IEEE Microwave Theory and Techniques (MTT) conference in San Diego, June, 1977, entitled "A New Microwave Amplitude Limiter Using GaAs Field Effect Transistor," by S. Fukuda, M. Kitamura, Y. Ara and I. Haga.) The single gate FET has a relatively high parasitic capacitance and results in an undesirably high feedback capacitance between the gate and drain electrodes. This feedback capacitance tends to reduce the small signal gain of the amplifier. The RF feedthrough from input to output of the FET is also decreased by this capacitance resulting in reduced saturation properties. These deficiencies can often be overcome by increasing the number of FET stages in the limiter disadvantageously adding, however, to the cost as well as size of the device.

SUMMARY OF THE INVENTION

According to the present invention, a power limiter generates an output RF signal of substantially constant power level in response to an input RF signal of varying power level. The limiter comprises a field effect type transistor having first and second gate, drain and source electrodes, the first gate electrode being receptive of the input RF signal. Included in the limiter is means for biasing the second gate electrode of the transistor such that the transistor operates in a gain region characterized by a power curve having a slope whose change in output power is substantially equal to or greater than the change in input power. The transistor also operates in a saturation region characterized by a power curve having a compression slope whose change in output power is substantially less than the change in input power such that the final output power variation is small compared to the input power variation. The substantially constant RF signal is generated over the saturation region.

BRIEF DESCRIPTION OF THE DRAWING

FIG. 2 is a graph showing the output power versus the input power of the power limiter of the present invention.

FIG. 3(a) is a block diagram illustrating the cascaded arrangement and the power distribution between the stages of the saturated amplifier of the preferred embodiment of the present invention.

FIGS. 3(b) to 3(d) are curves graphically showing the power variation of the cascaded stages of FIG. 3(a).

DETAILED DESCRIPTION OF THE PREFERRED EMBODIMENT

Figure 1:
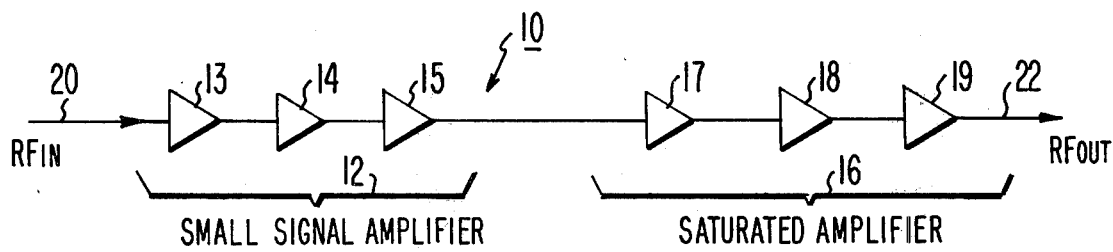
FIG. 1 is a diagrammatic representation of one embodiment of the invention showing a number of amplifier stages in cascaded arrangement.

Referring to the drawing, there is shown in FIG. 1, a microwave power limiter 10, comprising a multistage small signal amplifier 12 and a multistage saturated amplifier 16. Amplifiers 12 and 16 each comprise three stages 13, 14 and 15 and 17, 18 and 19, respectively, for purposes of illustration although any number of stages depending upon the desired operational characteristics of limiter 10 may be utilized. Stages 13, 14 and 15 of amplifier 12 and stages 17, 18 and 19 of amplifier 16 are connected in cascaded arrangement and each stage includes a dual-gate field effect transistor (FET) as will be explained in detail. An input RF signal 20 of varying power level is received by amplifier 12. An output RF signal 22 of constant power level is generated by limiter 10 in accordance with the invention as the output of amplifier 16. The stages of amplifiers 12 and 16 are biased by suitable bias arrangements (not shown in FIG. 1), the biasing of the stages to be described more fully with respect to FIGS. 4a–4c.

As shown in FIG. 2, the FETs of the stages of amplifiers 12 and 16 are biased to operate to have their output power vary as a function of input power in accordance with curve 24. FET characteristic power curve 24 has a gain region 26 and a saturation region 28. In gain region 26 the slope of curve 24 is such that the change in output power ($\Delta Po$) is equal to or greater than the change in input power ($\Delta Pi$). In the saturation region 28 the slope of curve 24 is such that the change in output power ($\Delta Po$) is substantially less than the change in input power ($\Delta Pi$). Over the saturation range 28, the output power of the FET is constant within a power output variation 30. As with conventional amplifiers operating in the saturated condition for limiter applications, the slope of curve 24 in the saturated region 28 is commonly referred to as the "compressive slope" or the power compression ratio of the limiter. As known in the limiter art, the compressive slope is expressed as the input power drive variation versus the output power change, or $\Delta Pi / \Delta Po$.

For power limiter applications, it is desirable to reduce the power output variation 30 to a minimum. The change in output power for an ideal power limiter is zero for changes in input power. Practical factors, such as bias voltages, FET configuration, FET circuitry and the FET material properties, typically limit the achievement of an ideal limiter, generally resulting in a certain amount of power output variation (30) in an individual limiter stage. Cascading of a number of FET stages and operating the FET stages in a saturated or overdriven condition will reduce the final output variation 30 to a level less than that variation for a single stage. By referring to FIGS. 3(a) to 3(d), such a cascaded arrangement may be more fully understood.

In the cascaded arrangement of FIG. 3(a), stages 17, 18 and 19 of saturated amplifier 16 are connected such that output power range ($P_3$ to $P_4$) of stage 17 is the input power range to stage 18, and the output power range ($P_5$ to $P_6$) of stage 18 is the input power range to stage 19. Power range $P_3$ to $P_4$ and range $P_5$ to $P_6$ are the output power variations of stages 17 and 18, respectively. $P_1$ to $P_2$ is the input power range to stage 17 as received from the output of small signal amplifier 12. $P_7$ to $P_8$ is the final power output variation as the output signal of stage 19. Curves 32, 34 and 36 represent the characteristic curves of the FETs of stages 17, 18 and 19 respectively as shown in FIGS. 3(b), 3(c) and 3(d). By applying the output of a preceding stage as the input of a succeeding stage as the FETs are operated in a saturated condition in which the change in output power is less than the change in input power, the final power output variation, e.g., $P_7$ to $P_8$, can be reduced, as shown graphically in FIGS. 3(b) through 3(d). In such a cascaded arrangement the final power output variation can be reduced even further by adding more stages. It should be appreciated that depending upon the power output variation tolerable in a particular limiter operation, cascaded FET stages may not be needed, the output of a single stage being satisfactory.

In the preferred embodiment shown in FIG. 1, small signal amplifier 12 is utilized to produce a power level which is compatible with the desired power level of saturated amplifier 16. The FETs of each of the stages 13, 14 and 15 are biased to operate in the gain region 26 as shown in FIG. 2 such that the change in output power is equal to or greater than the change in input power. By cascading stages operating in the gain region such that the output of a preceding stage provides the input of a succeeding stage the gain level of the final output stage 15 can be increased over the gain level to the input stage 13. It should be understood that the gain level provided by small signal amplifier 12 to saturated amplifier 16 can be changed by increasing or decreasing the number of stages. It should also be appreciated that small signal amplifier 12 may be eliminated in a system where the gain level of the RF input signal 20 is compatible with the gain level of the saturated amplifier 16.

Figure 4A:
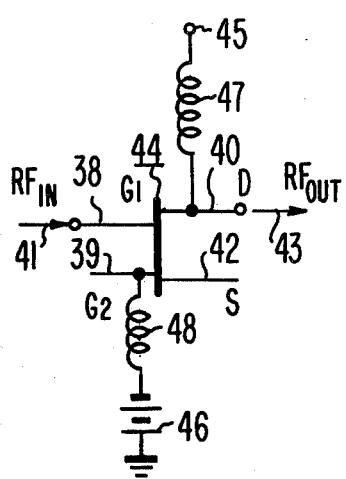
FIGS. 4(a) to 4(c) are schematic representations of biasing arrangements utilized to bias the FETs of the amplifier stages in the limiter of FIG. 1.

Each of the FETs in the stages of amplifiers 12 and 16 have first gate 38, second gate 39, drain 40 and source 42 electrodes as shown schematically on FET 44 in FIG. 4(a). In the preferred embodiment, FET 44 is a Gallium Arsenide (GaAs) metal semiconductor field effect transistor (MESFET), although other field effect type transistors such as, for example, junction field effect transistors (JFET), wherein the current is controlled by an electric field, may also be used. FET 44 may be biased by applying a dc voltage to second gate electrode 39 as by battery 46 through an inductor 48. The other terminal of battery 46 may be grounded. Biasing of FET 44 may also be achieved by pulsed voltages as well as by dc voltages. An input RF signal 41 is received at first gate electrode 38 and an output RF signal 43 is generated at drain electrode 40. Drain electrode 40 is biased by applying a suitable voltage to terminal 45 through an inductor 47, for example.

Figure 4B:
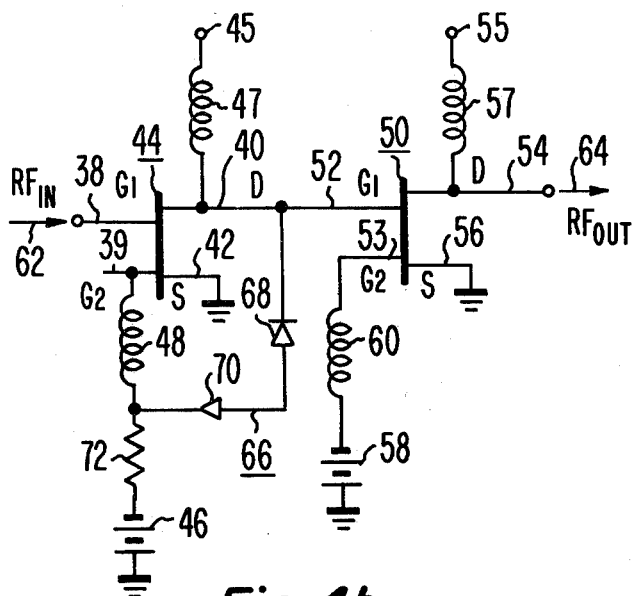

A biasing arrangement for cascaded FETs is shown in FIG. 4(b). For example, FET 44 with the biasing circuit as shown in FIG. 4(a), may be cascaded with an FET 50 of a succeeding stage. FET 50 has first gate 52, second gate 53, drain 54 and source 56 electrodes. Drain electrode 40 of FET 44 is connected to first gate electrode 52 of FET 50 and the source electrodes 42 and 56 respectively of each FET 44 and 50 are grounded. A battery 58 provides a predetermined dc voltage to second gate electrode 53 through an inductor 60, the other terminal of battery 58 being grounded. The drain electrode 54 is biased by applying a suitable voltage to terminal 55 through inductor 57, for example. An input RF signal 62 may be applied at first gate electrode 38 and an output RF signal 64 generated at drain electrode 54. In the preferred embodiment of the invention, a feedback network 66 may be connected between the drain electrode 40 and second gate electrode 39 of each of the FETs utilized. Feedback circuit 66 feeds a portion of the output signal from drain electrode 40 back as an input signal to second gate electrode 39. Network 66 comprises a detector diode 68 and a video amplifier 70. A resistor 72 may be connected between network 66 and battery 46 to isolate the feedback signal from the dc voltage. In the operation of FETs in the saturated condition, in particular, feedback network 66 augments the biasing of FET 44, to reduce the power output variation 30 (FIG. 2). Such a feedback network may result in a lesser number of limiter stages required to achieve a desired power output variation 30 than in a cascaded amplifier without a feedback network.

Figure 4C:
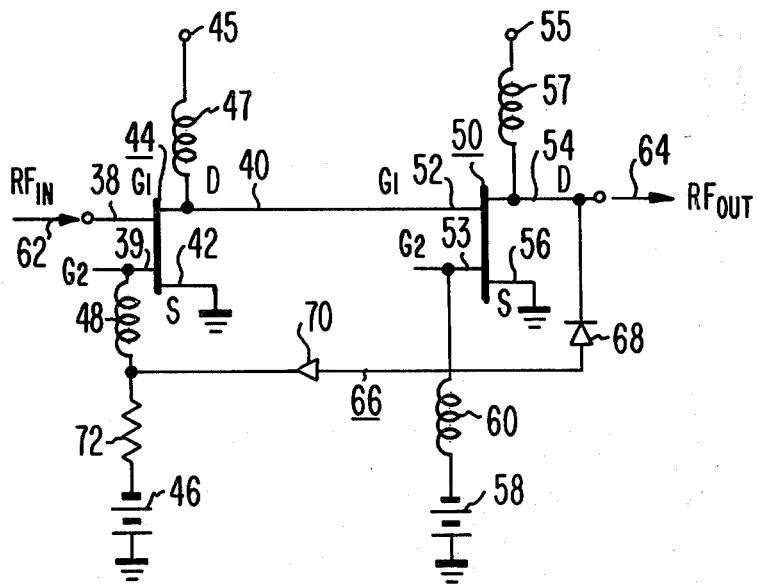

In FIG. 4(c) there is shown a modified arrangement of the biasing configuration of 4(b). In this arrangement of FIG. 4(c), the feedback network 66 is connected between second gate electrode 39 and drain electrode 54 of successively cascaded FETs 44 and 50. The output power can be further limited as a function of RF input drive by using such a form of the feedback network 66 as shown in FIG. 4(c). Here the RF output power of the succeeding (or later) FET 50 is detected and amplified to provide inverse feedback to second gate 39 of the preceding FET 44. Thus, an increase in power with drive causes the gain of FET 44 to be reduced. This in turn reduces or nullifies the increase in RF power, enhancing the limiting function.

The use of dual-gate FETs provides desirable functional advantages over the known prior art devices, in particular, the single gate FET. The dual-gate structure, which, in addition to increased gain and stability, has enhanced functions due to the presence of two independent control gates. A device having the second gate with a deeper pinch-off voltage has been found to exhibit noise, stability, and gain control characteristics at microwave frequencies. (For a further explanation of dual gate FETs see "Single-and Dual-Gate GaAs Schottky-Barrier FET's for Microwave Frequencies," by S. Asai, H. Kurono, S. Takahaski, M. Hirao and H. Kodera, Proc. of the 5th Conf., (1973 International) on Solid State Devices, Tokyo, 1973, Supplement to the Journal of the Japan Society of Applied Physics, Vol. 43, 1974 and "Performance of Dual-Gate GaAs MESFETs as Gain-Controlled Low-Noise Amplifiers and High Speed Modulators," by G. A. Liechti, ISSCC 75, WPM 7.2, Feb. 12, 1975.) In the dual gate FET, gate 39 is biased to achieve a desirable gain level and saturation operation while the input RF signal is applied to the other gate 38. The dual gate device significantly reduces the capacitance between the signal input gate 38 and drain electrode 40 over an equivalent single-gate device. This provides for an increased small-signal gain per stage compared to a single-gate device having an equivalent gate length. The reduction in the capacitance also decreases direct RF feedthrough from input to output which enhances the overdrive or saturation characteristics of the FET.

A dual gate GaAs FET power limiter has been tested, the limiter comprising a small signal amplifier 12 of three stages and a saturated amplifier 16 of four stages. The limiter was arranged to operate in C-band, and more particularly, a 5 GHz. The limiter was driven over an input power range from 0 to +15 mW and the small signal amplifier was biased to have a small signal gain of approximately 7 db. Under these operating conditions, the limiter exhibited a gain of unity at point 29 as shown in FIG. 2 where the input drive level and thereby the power output was about 6 mW. At this drive level and beyond, the compressive slope of the limiter (given by $\Delta Pi/\Delta Po$) was 9 mW/0.3 mW or 14.8 db. Such a limiter can achieve a power output variation within 0.025% of the input power variation to obtain a frequency accuracy of 1 MHz in a 4 GHz bandwidth for use in frequency discriminator applications. This is equivalent to an incremental power output fluctuation of 1 part in 4000, i.e., 36 db down from saturation over the total variation in the input drive range. Assuming an input drive range of 31 db, the combined value of input power swing and output limiting is equivalent to an overall compression ratio of 67 db. Such an FET limiter requires no circulators or isolators since the amplifier stages use three-terminal devices as straight through amplifiers resulting in considerably improved fine grain structure and simplification of circuitry.

What is claimed is:

1. A power limiter for generating an output RF signal of substantially constant power level in response to an input RF signal of varying power level, comprising:
   a field effect type transistor having first and second gate, drain and source electrodes, said first gate electrode being receptive of said input RF signal;
   means for biasing said second gate electrode of said transistor such that said transistor operates in a gain region characterized by a power curve having a slope whose change in output power is substantially equal to or greater than the change in input power, and a saturation region characterized by a power curve having a compression slope whose change in output power is substantially less than the change in input power, such that the final output power variation is small compared to the input power variation,
   said substantially constant output RF signal being generated over said saturation region.

2. A power limiter according to claim 1, further including a feedback circuit connected between said drain and said second gate electrodes to provide a predetermined voltage to said transistor to reduce said final output power variation.

3. A power limiter for generating an output RF signal of substantially constant power level in response to an input RF signal of varying power level, comprising:
- a first multistage amplifier responsive to said input RF signal for generating a first output RF signal;
- a second multistage amplifier responsive to said first output RF signal for generating a second output RF signal;
- each of said frist and second amplifiers including field effect type transistors each having first and second gate, drain and source electrodes in each stage, said transistors of each amplifier being connected in cascaded arrangement such that the first gate electrode of a succeeding transistor is connected to the drain electrode of a preceding transistor;
- means for biasing said second gate electrodes of said transistors of said first amplifier to produce a predetermined gain level of said first output RF signal; and
- means for biasing said second gate electrodes of said transistors of said second amplifier such that said second amplifier is operated in a saturated condition at the gain level of said first output RF signal, such that said second output RF signal is substantially constant with said varying input RF power and the final output power variation is small compared to the input power variation.

4. A power limiter according to claim 3, further including a feedback circuit between the second gate and drain electrodes of each transistor of said second amplifier to provide a predetermined voltage of each transistor to reduce said final output power variation.

5. A power limiter according to claim 3, further including a feedback circuit between the second gate electrode of a preceding transistor and the drain electrode of a succeeding transistor of said second amplifier to provide a predetermined voltage to said preceding transistor to reduce said final output power variation.

* * * * *

UNITED STATES PATENT AND TRADEMARK OFFICE
CERTIFICATE OF CORRECTION

PATENT NO. : 4,167,681

DATED : September 11, 1979

INVENTOR(S) : Herbert J. Wolkstein et al.

It is certified that error appears in the above-identified patent and that said Letters Patent is hereby corrected as shown below:

Column 1, line 34, "osscilloscope" should be --oscilloscope--.

Column 1, line 38, "discrimination" should be --discriminators--.

Column 2, line 17, "case" should be --cause--.

Column 6, line 21, "a" should be --at--.

Column 8, line 12, "of" should be --to--.

Signed and Sealed this

Eleventh Day of December 1979

[SEAL]

Attest:

SIDNEY A. DIAMOND

Attesting Officer

Commissioner of Patents and Trademarks